(12) United States Patent
Robin et al.

(10) Patent No.: US 10,153,393 B2
(45) Date of Patent: Dec. 11, 2018

(54) LIGHT EMITTING DIODE OF WHICH AN ACTIVE AREA COMPRISES LAYERS OF INN

(71) Applicants: COMMISSARIAT A L'ENERGIE ATOMIQUE ET AUX ENERGIES ALTERNATIVES, Paris (FR); ALEDIA, Grenoble (FR)

(72) Inventors: Ivan-Christophe Robin, Grenoble (FR); Amelie Dussaigne, Bizonnes (FR)

(73) Assignees: Commissariat à l'énergie atomique et aux énergies alternatives, Paris (FR); ALEDIA, Grenoble (FR)

( * ) Notice: Subject to any disclaimer, the term of this patent is extended or adjusted under 35 U.S.C. 154(b) by 0 days.

(21) Appl. No.: 14/913,254

(22) PCT Filed: Aug. 21, 2014

(86) PCT No.: PCT/EP2014/067843
§ 371 (c)(1),
(2) Date: Feb. 19, 2016

(87) PCT Pub. No.: WO2015/025007
PCT Pub. Date: Feb. 26, 2015

(65) Prior Publication Data
US 2016/0204307 A1   Jul. 14, 2016

(30) Foreign Application Priority Data
Aug. 22, 2013 (FR) ..................... 13 58121

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0075* (2013.01); *H01L 33/32* (2013.01); *H01L 33/08* (2013.01); *H01L 33/18* (2013.01)

(58) Field of Classification Search
CPC ..................... H01L 33/06; H01L 33/32; H01L 33/02–33/346
See application file for complete search history.

(56) References Cited

U.S. PATENT DOCUMENTS 6,455,870 B1    9/2002  Wang et al.
2004/0125839 A1   7/2004  Lee et al.
(Continued)

FOREIGN PATENT DOCUMENTS

DE   10 2010 012 711 A1   9/2011
EP    1 411 559 A2    4/2004
(Continued)

OTHER PUBLICATIONS

Ohashi et al., 'High structural quality InN/In0.75Ga0.25N multiple quantum wells grown by molecular beam epitaxy,' 2006, Appl. Phys. Lett., vol. 89, p. 041907.*

(Continued)

*Primary Examiner* — Bryan Junge
(74) *Attorney, Agent, or Firm* — Oblon, McClelland, Maier & Neustadt, L.L.P.

(57) ABSTRACT

A light emitting diode including an n-doped $In_{Xn}Ga_{(1-Xn)}N$ layer and a p-doped $In_{Xp}Ga_{(1-Xp)}N$ layer, and an active area arranged between the $In_{Xn}Ga_{(1-Xn)}N$ layer and the $In_{Xp}Ga_{(1-Xp)}N$ layer including: a first InN layer with a thickness $e_{InN106}$; a second InN layer with a thickness $e_{InN108}$; a separating layer arranged between the InN layers and including $In_{Xb}Ga_{(1-Xb)}N$ and a thickness <3 nm; an $In_{X1}Ga_{(1-X1)}N$ layer arranged between the $In_{Xn}Ga_{(1-Xn)}N$ layer and the first InN layer; an $In_{X2}Ga_{(1-X2)}N$ layer arranged between the (Continued)

$In_{Xp}Ga_{(1-Xp)}N$ layer and the second InN layer; wherein the indium compositions Xn, Xp, Xb, X1 and X2 are between 0 and about 0.25, and wherein the thicknesses $e_{InN106}$ and $e_{InN108}$ are such that $e_{InN106} < e_{InN108}$.

12 Claims, 4 Drawing Sheets

(51) Int. Cl.
*H01L 33/32* (2010.01)
*H01L 33/08* (2010.01)
*H01L 33/18* (2010.01)

(56) References Cited

U.S. PATENT DOCUMENTS

| 2007/0159067 | A1 | 7/2007 | Yun et al. |
| 2008/0111144 | A1 | 5/2008 | Fichtenbaum et al. |
| 2008/0283818 | A1 | 11/2008 | Odnoblyudov et al. |
| 2011/0204328 | A1 | 8/2011 | Tansu et al. |
| 2012/0241770 | A1* | 9/2012 | Na .................. H01L 33/06 257/86 |
| 2013/0028281 | A1 | 1/2013 | Avramescu et al. |

FOREIGN PATENT DOCUMENTS

| EP | 1 903 619 A1 | 3/2008 |
| JP | 2004-140370 A | 5/2004 |
| JP | 2008-226930 A | 9/2008 |
| JP | 2009-152474 A | 7/2009 |
| JP | 2013-138126 A | 7/2013 |
| WO | 2008/060531 A2 | 5/2008 |
| WO | 2010/112310 A1 | 10/2010 |

OTHER PUBLICATIONS

Yamaguchi et al., 'Application of Deri method to InN/InGaN MQW, thick InGaN and InGaN/InGaN MQW structure growth,' 2013, Proc. of SPIE, vol. 8625, p. 862502.*

Hasan et al., 'Two dimensional electron gas in InN-based heterostructures: Effects of spontaneous and piezoelectric polarization,' 2008, Solid State Electronics, vol. 52, pp. 134-139.*

Hongping Zhao, et al.. "Approaches for high internal quantum efficiency green InGaN light-emitting diodes with large overlap quantum wells." Optics Express, vol. 19, Issue S4, pp. A991-A1007, 2011.

A. Yoshikawa, et al., "Proposal and achievement of novel structure InN/GaN multiple quantum wells consisting of 1 ML and fractional monolayer InN wells inserted in GaN matrix," Applied Physics Letters 90, 073101, 2007, 4 pages.

A. Yoshikawa, et al., "Fabrication and Characterization of Novel Monolayer InN Quantum Wells in a GaN Matrix", Journal of Vacuum Science and Technology B, 26 1551, 2008, 10 pages.

Akihiko Yuki, et al., "1-2 ML thick InN-based quantum wells with InGaN barriers for blue-green light emitters", Physica Status Solidi C 6, No. S2, S417-S420, 2009, 4 pages.

International Search Report dated Oct. 28, 2014 in PCT/EP2014/067843 Filed Aug. 21, 2014.

French Search Report dated Apr. 11, 2014 in FR 1358121 Filed Aug. 22, 2013.

Japanese Office Action dated Jun. 25, 2018 in Patent Application No. 2016-535482 (with English translation), citing documents AO-AS therein, 6 pages.

* cited by examiner

LIGHT EMITTING DIODE OF WHICH AN ACTIVE AREA COMPRISES LAYERS OF INN

TECHNICAL FIELD AND PRIOR ART

The invention relates to the field of light emitting diodes (LEDs) as well as that of light emissive devices comprising such LEDs (screens, projectors, screen walls, etc.). The invention is advantageously applicable to LEDs emitting in the wavelength range corresponding to the green and/or red colour, that is in the wavelength range between about 500 nm and 700 nm.

Currently, LEDs emitting in the wavelength range corresponding to the green colour are mainly manufactured with InGaN quantum wells comprising a significant indium composition, that is higher than about 25%, with respect to gallium. Such LEDs are for example described in documents US 2013/0028281 A1 and "Approaches for high internal quantum efficiency green InGaN light-emitting diodes with large overlap quantum wells" by H. Zhao et al., Optics Express, Vol. 19, Issue S4, pp. A991-A1007, 2011.

One of the problems of these LEDs is that an alloy demixing occurs in such InGaN quantum wells, which does not enable good radiative efficiencies to be obtained within such quantum wells because of the defects generated by this alloy demixing. Another problem of these LEDs is related to the high stress which exists between the GaN of the barrier layers (between which the quantum wells are located) and the InGaN of the quantum wells, this stress resulting from the lattice constant difference between both these materials and causing defect formation, for example dislocations, in the quantum wells. This stress also tends to promote the demixing of the quantum wells InGaN.

To reduce dislocations in the quantum wells, document "Proposal and achievement of novel structure InN/GaN multiple quantum wells consisting of 1 ML and fractional monolayer InN wells inserted in GaN matrix" by A. Yoshikawa and al., Appl. Phys. Lett. 90, 073101 (2007) describes a multiple quantum well LED, each of the quantum wells being formed by an InN layer the thickness of which is equal to one or two monolayers, each InN layer being arranged between two GaN barrier layers with a thickness equal to about 15 nm. FIG. 1 shows the radiative recombination rates, on a logarithmic scale and per $cm^3 \cdot s$, obtained in a LED comprising a quantum well formed by an InN layer with a thickness equal to 2 monolayers and arranged between two GaN barrier layers each with a thickness equal to about 10 nm. But, it can be seen in this figure that the radiative recombination rate in the InN layer is in the same order of magnitude as that in the GaN barrier layer located on the n side of the LED, and is relatively low (in the order of $10^{21}$ recombinations·$cm^{-3} \cdot s^{-1}$) because of the very low density of states in the InN layer. In addition, with such a quantum well, it is difficult to have a light emission in the wavelength range corresponding to the green colour.

To address the problem of the emission wavelength range of the LED described above, document "1-2 ML thick InN-based quantum wells with InGaN barriers for blue-green light emitters" by A. Yuki et al., PHYSICA STATUS SOLIDI C 6; n° S2; S417-S420 (2009) suggests to separate the different quantum wells not by GaN barrier layers, but by InGaN barrier layers each with a thickness equal to about 10 nm. The use of InGaN to make barrier layers between the different quantum wells enables the values of the wavelengths emitted by the LED to be increased.

FIG. 2 shows the radiative recombination rate, on a logarithmic scale and per $cm^3 \cdot s$, obtained in a quantum well formed by an InN layer with a thickness equal to 2 monolayers and arranged between two $In_{0.2}Ga_{0.8}N$ barrier layers each with a thickness equal to about 10 nm. But, as for the quantum well the radiative recombination rate of which is shown in FIG. 1, the radiative recombination rate in the InN layer is also herein in the same order of magnitude as that of the InGaN barrier layer located on the n side of the LED, and is relatively low (in the order of $10^{21}$ recombinations·$cm^{-3} \cdot s^{-1}$) because of the very low density of states in the InN layer.

Document US 2011/0204328 A1 describes a symmetric quantum well comprising an InN centre layer arranged between two InGaN barrier layers. As previously, the very low density of states in the InN layer does not enable to have a satisfactory radiative recombination rate to obtain a sufficient emission in the desired wavelength range.

DISCLOSURE OF THE INVENTION

One purpose of the present invention is to provide a light emitting diode enabling a better radiative recombination rate to be obtained and thus to have a better emission efficiency, in particular in the wavelength range corresponding to the green or red colour, while avoiding defect and alloy demixing problems in the active area of the light emitting diode.

To do so, the present invention provides a light emitting diode including at least one n-doped $In_{Xn}Ga_{(1-Xn)}N$ layer and a p-doped $In_{Xp}Ga_{(1-Xp)}N$ layer forming together a p-n junction of the diode, and an active area arranged between the n-doped $In_{Xn}Ga_{(1-Xn)}N$ layer and the p-doped $In_{Xp}Ga_{(1-Xp)}N$ layer and wherein radiative recombinations are able to occur, the active area including at least:

a first InN layer with a thickness $e_{InN106}$;
a second InN layer with a thickness $e_{InN108}$;
a separating layer arranged between the first InN layer and the second InN layer and such that the first InN layer is arranged between the separating layer and the n-doped $In_{Xn}Ga_{(1-Xn)}N$ layer, the separating layer comprising $In_{Xb}Ga_{(1-Xb)}N$ and a thickness lower than or equal to about 3 nm;
an $In_{X1}Ga_{(1-X1)}N$ layer arranged between the n-doped $In_{Xn}Ga_{(1-Xn)}N$ layer and the first InN layer;
an $In_{X2}Ga_{(1-X2)}N$ layer arranged between the p-doped $In_{Xp}Ga_{(1-Xp)}N$ layer and the second InN layer;
wherein the indium compositions Xn, Xp, Xb, X1 and X2 are between 0 and about 0.25, and wherein the thicknesses $e_{InN106}$ and $e_{InN108}$ are such that $e_{InN106} \leq e_{InN108}$.

Thanks to the low thickness of the layer separating both InN layers, the charge carriers can easily switch from one InN layer to the other. Thus, the second InN layer located on the p side of the diode forms a hole reserve, these holes easily switching to the first InN layer which is located on the n side of the diode. Substantially equivalent electron and hole concentrations are obtained in the first InN layer, which enables to have a very high radiative recombination rate in this first InN layer, and thus a better emission efficiency of the light emitting diode than those of prior art. Furthermore, in view of the materials used, a light emission in the wavelength range corresponding to the green or red colour is actually achieved. Finally, this excellent emission efficiency is achieved without resorting to high indium concentration InGaN, which enables to avoid alloy demixing and defect problems in the active area of the light emitting diode.

The thickness lower than or equal to 3 nm of the layer separating both InN layers thus enables to obtain an asymmetric tunnel effect, that is the electrons are trapped in the first InN layer (the one located on the side of the n-doped $In_{Xn}Ga_{(1-Xn)}N$ layer) whereas the holes can switch from the second InN layer (the one located on the side of the p-doped $In_{Xp}Ga_{(1-Xp)}N$ layer) to the first InN layer. The second InN layer forms a hole reserve and the first InN layer forms the emissive layer of the diode.

The thicknesses eInN106 and eInN108 may be between 1 monolayer and 3 monolayers, and advantageously between 1 monolayer and 2 monolayers.

When the or each of the first InN layer and the second InN layer has a thickness between 2 monolayers and 3 monolayers, the indium composition Xb may be higher than or equal to about 0.15. When the indium composition Xb is lower than about 0.15, the thickness of said one or each of the first InN layer and the second InN layer may be lower than or equal to 2 monolayers.

The thicknesses $e_{InN106}$ and $e_{InN108}$ may be such that $e_{InN106} < e_{InN108}$. This configuration enables the roles of emissive layer and hole reserve respectively played by the first InN layer and the second InN layer to be enhanced.

The indium compositions X1 and X2 may be such that X1≤X2. The indium compositions Xn, Xp, Xb, X1 and X2 may be such that Xn<X<X2<Xp, which enables the electron distribution to be homogenized in the different layers of the active area. The indium compositions Xn, Xp, X1, Xb and X2 may be such that Xn=Xp=0 and/or X1=Xb=X2, which enables the manufacture of the light emitting diode to be simplified.

The thickness of the n-doped $In_{Xn}Ga_{(1-Xn)}N$ layer and/or the thickness of the p-doped $In_{Xp}Ga_{(1-Xp)}N$ layer may be between about 20 nm and 10 µm, and/or the thickness of the $In_{X1}Ga_{(1-X1)}N$ layer and/or the thickness of the $In_{X2}Ga_{(1-X2)}N$ layer may be between about 1 nm and 200 nm.

The light emitting diode may further include a first metal electrode arranged against the n-doped $In_{Xn}Ga_{(1-Xn)}N$ layer and a second metal electrode arranged against the p-doped $In_{Xp}Ga_{(1-Xp)}N$ layer.

The active area of the light emitting diode may include a number of InN layers higher than 2, each of these InN layers being separated from the or each of the adjacent InN layers by a separating layer comprising InGaN or GaN and with a thickness lower than or equal to about 3 nm.

The light emitting diode may include several active areas arranged between the n-doped $In_{Xn}Ga_{(1-Xn)}N$ layer and the p-doped $In_{Xp}Ga_{(1-Xp)}N$ layer and wherein radiative recombinations are able to occur.

The light emitting diode may further include, between the n-doped $In_{Xn}Ga_{(1-Xn)}N$ layer and the active area, an n-doped InGaN buffer layer, the n-doped InGaN of the buffer layer including a band gap energy lower than or equal to about 97% of the band gap energy of the p-doped $In_{Xp}Ga_{(1-Xp)}N$.

The invention also relates to a method for making a light emitting diode as described above, wherein the layers of the light emitting diode are planar layers made by growing over each other, or wherein the layers of the light emitting diode are made by growing as radial or axial nanowires.

The invention also relates to a light emissive device comprising at least one light emitting diode as described above.

BRIEF DESCRIPTION OF THE DRAWINGS

The present invention will be better understood upon reading the description of exemplary embodiments given by way of purely indicating an in no way limiting purposes with reference to the appended drawings in which.

Identical, similar or equivalent parts of the different figures described hereinafter bear the same reference numerals so as to facilitate switching from one figure to the other.

The different parts shown in the figures are not necessarily drawn to a uniform scale, to make the figures more readable.

The different possibilities (alternatives and embodiments) should be meant as being not exclusive of each other and can be combined to each other.

DETAILED DISCLOSURE OF PARTICULAR EMBODIMENTS

Figure 3:
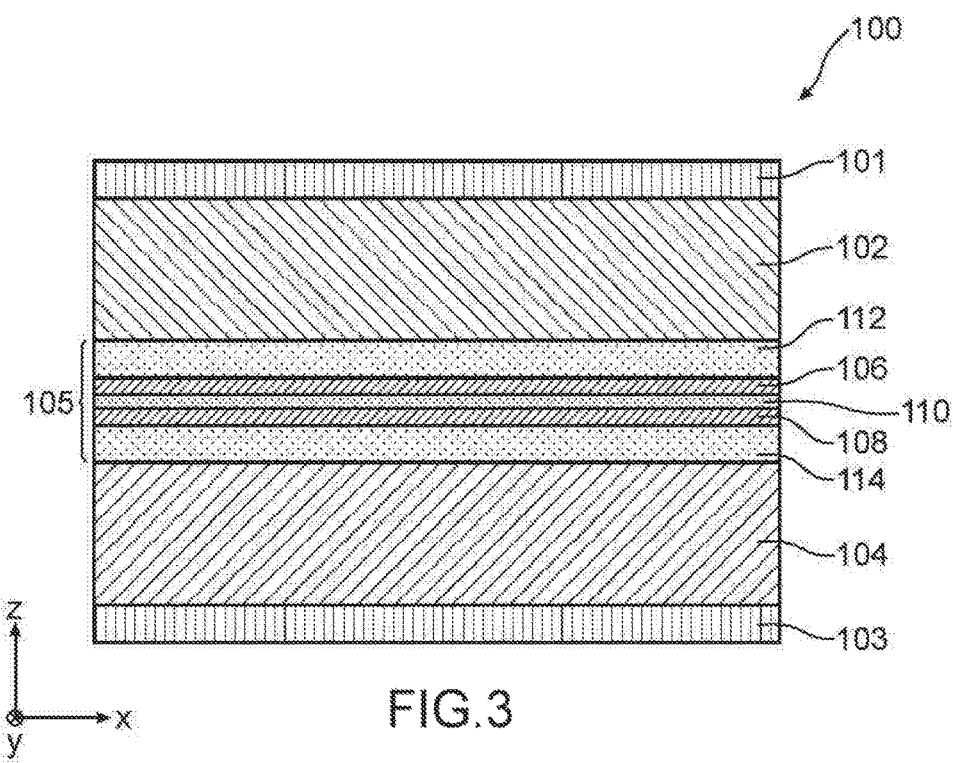
FIG. 3 schematically shows a light emitting diode, object of the present invention, according to a particular embodiment.

FIG. 3 is first referred to, which schematically shows a light emitting diode 100, or LED 100, according to a particular embodiment. In the notation $In_XGa_{(1-X)}N$ used hereinafter, X represents the indium composition of the material, that is the indium proportion with respect to the total amount of indium and gallium in the material $In_XGa_{(1-X)}N$.

The LED 100 includes a p-n junction formed by an n-doped $In_{Xn}Ga_{(1-Xn)}N$ layer 102 (also called $In_{Xn}Ga_{(1-Xn)}$ N-n), with a donor concentration equal to about $3.10^{18}$ donors/cm$^3$, and a p-doped $In_{Xp}Ga_{(1-Xp)}N$ layer 104 (also called $In_{Xp}Ga_{(1-Xp)}$N-p) with an acceptor concentration equal to about $2.10^{19}$ acceptors/cm$^3$. These two doped layers 102 and 104 each have for example a thickness (dimension along the axis Z shown in FIG. 3) between about 20 nm and 10 µm. A first metal electrode 101 is arranged against the $In_{Xn}Ga_{(1-Xn)}$N-n layer 102 and forms a cathode of the LED 100, and a second metal electrode 103 is arranged against the $In_{Xp}Ga_{(1-Xp)}$N-p layer 104 and forms an anode of the LED 100. Generally, the $In_{Xn}Ga_{(1-Xn)}$N-n layer 102 may have a donor concentration between about $10^{17}$ and $10^{20}$ donors/cm$^3$, and the $In_{Xp}Ga_{(1-Xp)}$N-p layer 104 may have an acceptor concentration between about $10^{15}$ and $10^{20}$ acceptors/cm$^3$.

The LED 100 includes, between the doped layers 102 and 104, an active area 105 in which radiative recombinations occur causing a light emission of the LED 100.

The active area 105 includes in particular a first InN layer 106 located on the side of the $In_{Xn}Ga_{(1-Xn)}$N-n layer 102, and a second InN layer 108 located on the side of the $In_{Xp}Ga_{(1-Xp)}$N-p layer 104. Both InN layers 106 and 108 are separated from each other by a thin separating layer 110 comprising $In_{Xb}Ga_{(1-Xb)}N$. Furthermore, the first InN layer 106 is separated from the $In_{Xn}Ga_{(1-Xn)}$N-n layer 102 by an $In_{X1}Ga_{(1-X1)}N$ layer 112, and the second InN layer 108 is separated from the $In_{Xp}Ga_{(1-Xp)}$N-p layer 104 by an $In_{X2}Ga_{(1-X2)}N$ layer 114.

All the layers of the active area 105 of the LED 100 (that is the layers 106, 108, 110, 112 and 114 in the example of FIG. 3) include unintentionally doped materials (with a residual donor concentration $n_{nid}$ equal to about $10^{17}$ cm$^{-3}$, or between about $10^{16}$ and $10^{20}$ donors/cm$^3$).

Generally, each of the indium compositions X1, X2 and Xb may be between 0 and 0.25 (when one of these indium compositions has a zero value, the material associated with this composition is then GaN). Furthermore, there is also X1≤X2. Advantageously, the indium compositions X1 and X2 are such that 0.05≤X1≤0.08 and 0.12≤X2≤0.2, and the indium composition Xb is such that 0.05≤Xb≤0.2.

The indium compositions Xn, X1, X2 and Xp of the layers 102, 112, 114 and 104 respectively are advantageously such that Xn<X<X2<Xp, which enables the electron distribution to be homogenized in the layers of the active area 105 of the LED 100. These indium compositions are for example such that Xn=0 (which means in this case that the n-doped layer 102 includes GaN-n), X1=0.05, X2=0.1 and Xp=0.18.

In order to simplify the manufacture of the LED 100, it is possible to have Xn=Xp=0 (the doped layers 102 and 104 then including respectively GaN-n and GaN-p) and/or to have X1=Xb=X2, which enables for example the layers 102, 104, 110, 112 and 114 to be made with a same growth temperature and/or the layers 106 and 108 to be made with a same growth temperature.

The thicknesses (dimensions along the axis Z shown in FIG. 3) of the InN layers 106 and 108, respectively noted as $e_{InN106}$ and $e_{InN108}$, are such that $e_{InN106} \leq e_{InN108}$. Each of these thicknesses $e_{InN106}$ and $e_{InN108}$ is between 1 monolayer and 3 monolayers (1 InN-monolayer corresponding to a thickness equal to about 0.25 nm), and preferably between 1 monolayer and 2 monolayers. However, when one or each of both thicknesses $e_{InN106}$ and $e_{InN108}$ is between 2 monolayers and 3 monolayers, it is for example possible to have Xb≥0.15. In a complementary way, when Xb<0.15, the thickness of this or each of these layers is preferably selected lower than or equal to about 2 monolayers.

In order to allow the charge carriers to easily switch from the second InN layer 108 to the first InN layer 106, the thickness of the separating layer 110 is lower than or equal to about 3 nm, and advantageously lower than or equal to about 2 nm. Unlike two quantum wells made one next to the other, both InN layers 106 and 108 are part of the same active area of the LED 100 and operate together to make a light emission from this active area 105 of the LED 100. The thicknesses of the layers 112 and 114 are between about 1 nm and 200 nm.

A first exemplary embodiment of the diode 100 is described below.

The n-doped layer 102 has a thickness equal to about 500 nm and includes GaN-n with a donor concentration equal to about $3.10^{18}$ donors/cm$^3$. The p-doped layer 104 has a thickness equal to about 500 nm and includes GaN-p with an acceptor concentration equal to about $2.10^{19}$ acceptors/cm$^3$. The layers 112 and 114 each have a thickness equal to about 5 nm and includes unintentionally doped GaN (GaN-nid) with a residual donor concentration $n_{nid}$ equal to about $10^{17}$ cm$^{-3}$. The InN layers 106 and 108 each have a thickness equal to about 2 monolayers and include InN-nid. Finally, the separating layer 110 has a thickness equal to about 1 nm and includes $In_{0.2}Ga_{0.8}$N-nid.

The simulations described below are made with the SILVACO® simulation software from ATLAS®.

Figure 1:
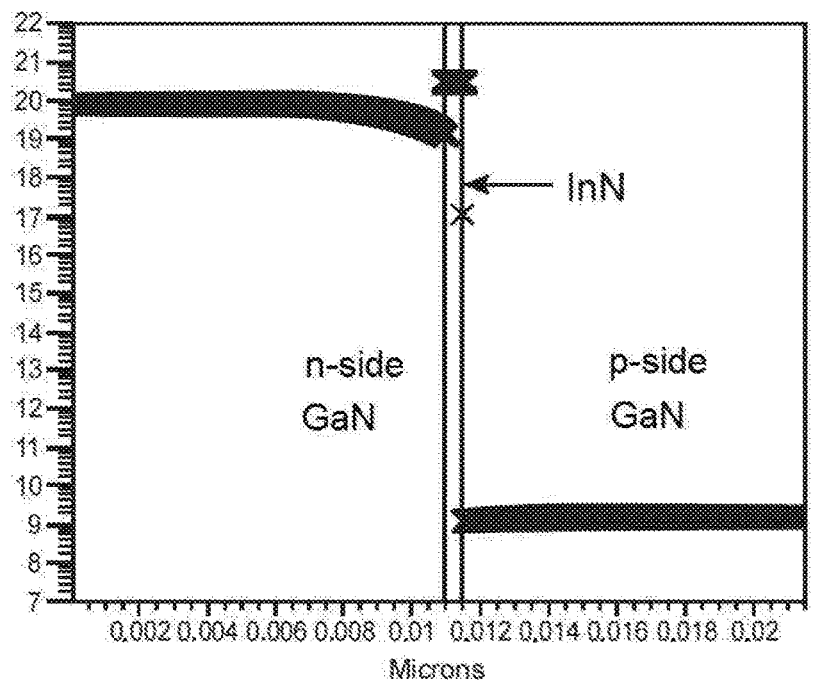
FIGS. 1 and 2 show radiative recombination rates obtained in light emitting diodes of prior art.
Figure 2:
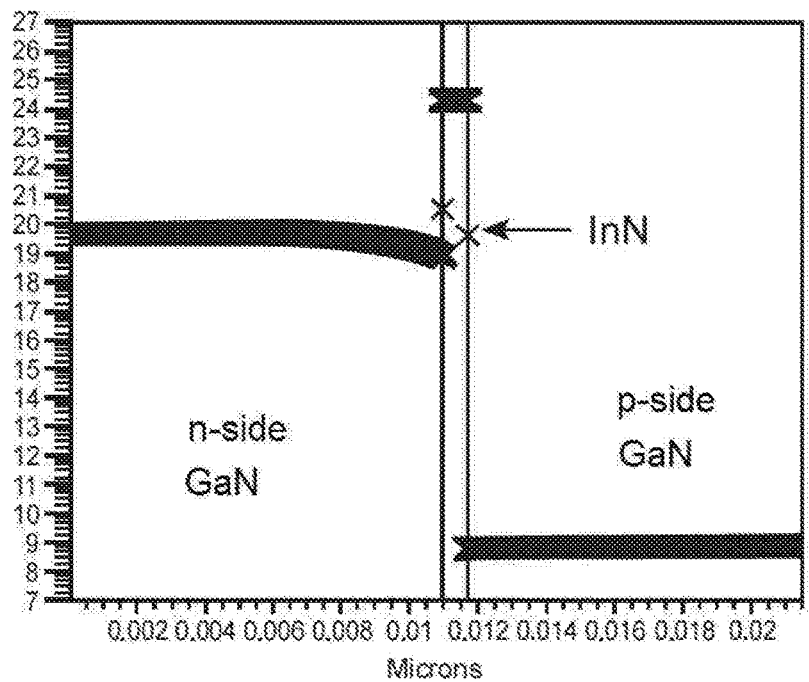
Figure 4:
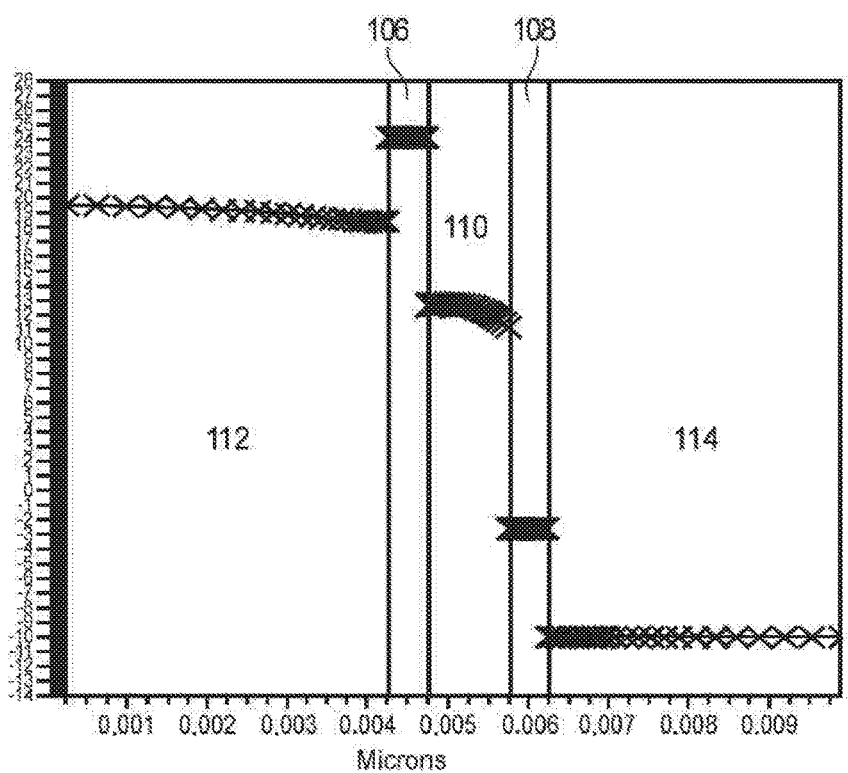
FIG. 4 shows the radiative recombination rate obtained in the active area of a light emitting diode, object of the present invention, according to a first exemplary embodiment.

FIG. 4 shows the radiative recombination rate obtained in the different layers of the active area 105 of the LED 100 according to the first exemplary embodiment described above. The references of the different layers of the LED 100 are reminded in FIG. 4, the vertical lines shown in FIG. 4 symbolizing the interfaces between the layers of the LED 100. It is seen in this figure that a maximum radiative recombination rate of about $10^{24}$ recombinaisons·cm$^{-3}$·s$^{-1}$ is obtained in the first InN layer 106 located on the side of the GaN-n layer 102, which is much higher than the rate of about $10^{21}$ recombinaisons·cm$^{-3}$·s$^{-1}$ obtained with a quantum well formed by a single InN layer arranged between two InGaN or GaN barrier layers as previously described in connection with FIGS. 1 and 2.

Figure 5:
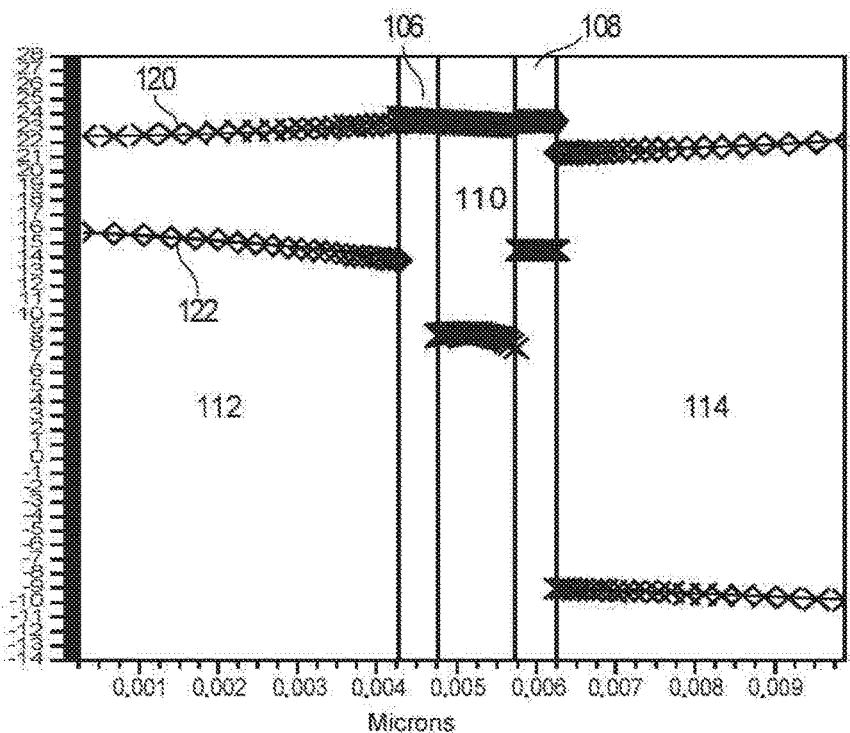
FIG. 5 shows the electron and hole concentrations obtained in the active area of the light emitting diode, object of the present invention, according to the first exemplary embodiment.

FIG. 5 shows the concentrations of electrons (represented by crosses referenced 120) and holes (represented by diamonds referenced 122), per cm$^3$, obtained in the different layers of the active area 105 of the LED 100 according to the first exemplary embodiment described above. This figure actually shows that in the first InN layer 106, on the side of the n-doped layer 102, the electron and hole concentrations are substantially equivalent, which allows to have a high radiative recombination rate in this first InN layer 106. This good radiative efficiency in the first InN layer 106 located on the side of the N-doped layer 102 is obtained in particular thanks to the use of the thin separating layer 110 between both InN layers 106, 108 because the second InN layer 108 thereby forms, towards the first InN layer 106, a hole reserve from which these holes migrate into the first InN layer 106.

A second exemplary embodiment of the LED 100 is described hereinbelow.

Figure 6:
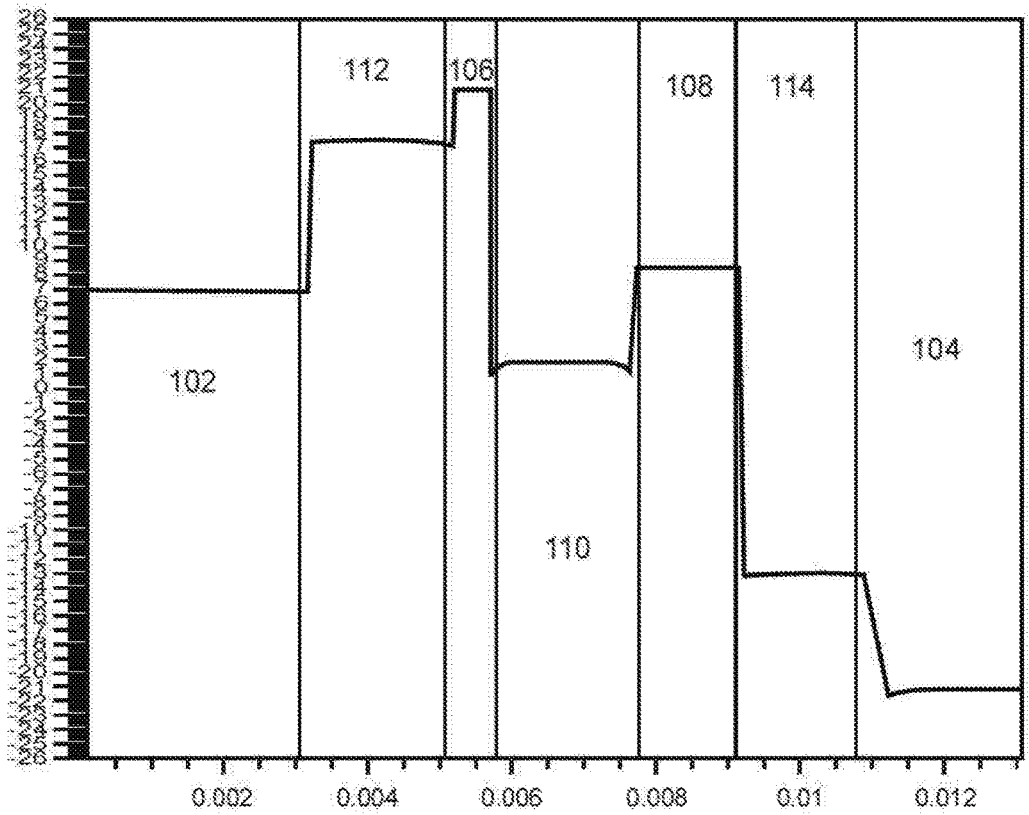
FIG. 6 shows the radiative recombination rate obtained in a light emitting diode, object of the present invention, according to a second exemplary embodiment.

The n-doped layer 102 has a thickness equal to about 500 nm and includes GaN-n with a donor concentration equal to about $3.10^{18}$ donors/cm$^3$. The p-doped layer 104 has a thickness equal to about 500 nm and includes GaN-p with an acceptor concentration equal to about $2.10^{19}$ acceptors/cm$^3$. The layers 112 and 114 each have a thickness equal to about 2 nm and include unintentionally doped $In_{0.2}Ga_{0.8}$N ($In_{0.2}Ga_{0.8}$N-nid) with a residual donor concentration $n_{nid}$ equal to about $10^{17}$ cm$^{-3}$. The two InN layers 106 and 108 both include InN-nid. In this second exemplary embodiment, both InN layers 106 and 108 have however different thicknesses. Thus, the first InN layer 106 located on the side of the n-doped layer 102 has a thickness equal to about 1 monolayer and the second InN layer 108 located on the side of the p-doped layer 104 has a thickness equal to about 3 monolayers s. Finally, the separating layer 110 has a thickness equal to about 2 nm and includes $In_{0.2}Ga_{0.8}$N-nid. The radiative recombination rate obtained in the LED 100 according to this second exemplary embodiment is shown in FIG. 6.

This dissymmetry in the thicknesses of the InN layers 106 and 108 enables the light emission made by the thinnest InN layer (here the first InN layer 106 located on the side of the n-doped layer 102) to be promoted because this low thickness enables to have a better control in the light emission made by the first InN layer 106. On the one hand, the higher thickness of the second InN layer 108 enables the role of reserve, or uptake, of holes filled by this layer to be enhanced, and thus the recombination rate occurring in the first InN layer 106 to be increased. On the other hand, with such a structure, because the first InN layer 106 is thinner, which causes an increase in the transition energy in the first InN layer 106 without modifying the gap thereof, an efficient light emission for wavelengths equal to about 530 nmn that is wavelengths corresponding to the green colour is obtained.

In all the modes and exemplary embodiments previously described, the active area 105 of the LED 100 may include more than two InN-nid layers, each of these InN layers being in this case separated from the or each of the adjacent InN layers by a thin separating layer similar to the layer 110 and comprising InGaN (the indium proportion of InGan of each of these thin separating layers may be similar or not from one layer to other) or GaN.

In addition, in all the modes and exemplary embodiments previously described, it is possible to make the LED 100 such that it includes, between the doped layers 102 and 104, several active areas, for example similar to the active area 105 previously described, which are arranged one above the other, and each including at least two InN layers separated from each other by a thin separating layer similar to the previously described separating layer 110. The LED then forms a multiple quantum well LED.

According to an alternative embodiment of the LED 100, it is possible to form, between the n-doped layer 102 and the $In_{X1}Ga_{(1-X1)}N$ layer 112, an InGaN buffer layer including a band gap energy lower than or equal to about 97% of the band gap energy of the $In_{Xp}Ga_{(1-Xp)}N$-p of the layer 104. Such a buffer layer creates, because of its band gap energy lower than or equal to about 97% of the band gap energy of the p-doped layer 104, that is such that the gap of this buffer layer is lower by at least 3% than the gap of the p-doped layer 104 ($Eg_{buffer} \leq 0.97\ Eg_{104}$), an asymmetry in the structure of the LED 100, and more particularly an asymmetry in the p-n junction of the LED 100. This asymmetry facilitates the circulation of holes in the LED 100 and enables a more homogenous distribution of the carriers (electrons and holes) to be obtained in the active area 105 of the LED 100. This results in a better light emission from the active area 105 of the LED 100 and thus in a better inner quantum yield of the LED 100. This buffer layer includes InGaN with advantageously an indium composition higher by at least 2.5% than the Xp value, that is the indium composition of the semiconductor of the p-doped layer 104.

The buffer layer and the n-doped layer 102 may include a semiconductor having identical composition and/or doping. Thus, the indium composition of the semiconductor of the n-doped layer 102 may be similar to the indium composition of the semiconductor of the buffer layer, and/or the donor concentration in the semiconductor of the n-doped layer 102 may be similar to the donor concentration in the n-doped semiconductor of the buffer layer.

Alternatively, the indium composition of the semiconductor of the buffer layer may vary along the thickness of the buffer layer, thus forming a gradient in the indium composition along the thickness of the buffer layer. It is also possible to make an (In,Ga)N/InGaN super-network for the buffer layer.

It is also possible that the LED 100 includes an electron-blocking layer, for example comprising AlGaN, arranged between the layer 114 and the p-doped layer 104. Such an electron-blocking layer enables electrons to be prevented from passing towards the p-doped layer 104. Such an electron-blocking layer also enables to decrease the DROOP, that is the loss in the inner quantum efficiency when the current density in the LED increases, this loss being partially due to the escape of electrons from the active area 105 when the current increases.

Such a LED 100 operates regardless of the orientation of the structure, whether along the plane c (under the presence of a strong internal electric field), the plane M, in semi-polar, etc.

The LED 100 may be made as a planar diode as shown in FIG. 3, that is as a stack of layers formed on a substrate (the substrate not being shown in FIG. 3), the main faces of the different layers being arranged in parallel to the plane of the substrate (parallel to the plane (X,Y)).

An exemplary embodiment of the LED 100 in the form of such a planar diode is described hereinbelow.

First, the growth of a first GaN layer with a thickness equal to about 21 µm is made on a sapphire substrate, for example by MOCVD ("Metal Organic Chemical Vapour Deposition") at a temperature of about 1000° C. This growth is completed by forming the n-GaN layer 102 doped by silicon at $3.10^{18}$ donors/cm$^3$, with a thickness of about 500 nm. The temperature is then lowered at about 830° C. to grow about 10 nm of unintentionally doped $In_{0.05}Ga_{0.95}N$, forming the layer 112. The temperature is then lowered to about 600° C. to grow 3 unintentionally doped InN monolayers, forming the first InN layer 106. The temperature is raised to about 720° C. to grow 1 nm of unintentionally doped $In_{0.2}Ga_{0.8}N$, forming the separating layer 110. The temperature is again lowered to about 600° C. to grow 2 unintentionally doped InN monolayers, forming the second InN layer 108. The temperature is raised again to about 750° C. to grow 10 nm of unintentionally doped $In_{0.12}Ga_{0.88}N$, forming the layer 114. The temperature is lowered to about 730° C. to grow 500 nm of magnesium-doped $In_{0.18}Ga_{0.82}N$, forming the layer 104. The second metal electrode 103 is then made as a Ni/Au layer on the p-doped layer 104, and the first metal electrode 101 is finally made as a Ti/Au layer on the n-doped layer 102 (after the n-doped layer 102 is unsecured from the first GaN layer with a thickness equal to about 2 µm).

Figure 7A:
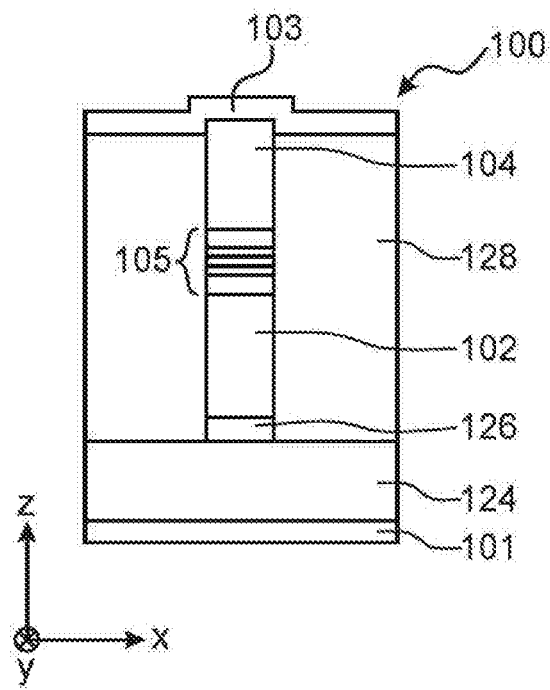
FIGS. 7A and 7B schematically show light emitting diodes, object of the present invention, made as nanowires.

Alternatively, the LED 100 may be made as nanowires. FIG. 7A shows such a LED 100 made as axial nanowires, these nanowires including a stack formed by the first electrode 101, a substrate 124 of n-type semiconductor (for example gallium), a nucleation layer 126 enabling the nanowires, the n-doped layer 102, the active area 105, the p-doped layer 104, and the second electrode 103 to be grown. An insulating material 128 may surround at least one part of these nanowires which extend parallel to the axis Z.

Figure 7B:
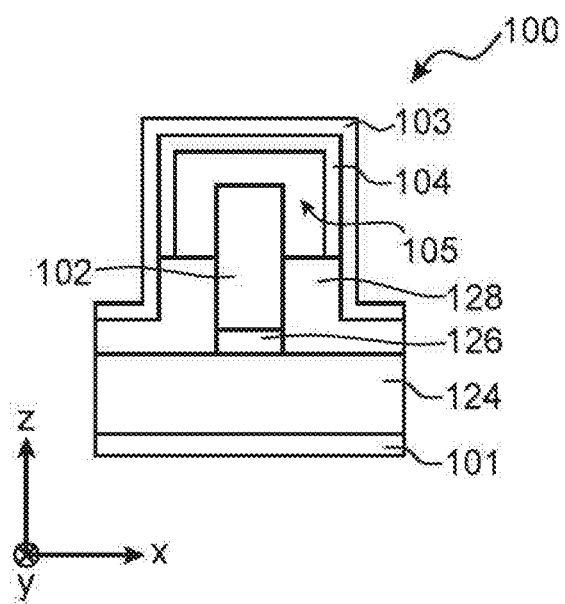

FIG. 7B shows a LED 100 made as radial nanowires, these nanowires including a stack formed by the first electrode 101, the semiconductor substrate 124, the nucleation layer 126 and the n-doped layer 102. Insulating portions 128 partly surround the n-doped layer 102 and the nucleation layer 126. The active area 105 (formed at least by the layers 106, 108, 110, 112 and 114) is made such that it surrounds at least partly the n-doped layer 102. The p-doped layer 104 is made such that it surrounds the active area 105. Finally, the second electrode 103 is made by covering the p-doped layer 104.

Alternatively to the two exemplary embodiments described in FIGS. 7A and 7B, the structure of these nanowires can be inverted, with in this case a semiconductor substrate 124, for example of p-type gallium nitride, on which the p-doped layer 104 is made, and then the other elements of the LED 100 in the order reverse to the one described in FIGS. 7A and 7B.

An exemplary embodiment of the diode 100 in the form of radial nanowires is described hereinbelow.

Silicon-doped GaN nanowires with a donor concentration equal to about $3.10^{18}$ donors/cm$^3$ are made by growing on a sapphire substrate, for example by MOCVD at a temperature of about 1050° C., also forming a silicon-doped GaN layer between the nanowires, the assembly corresponding to the first n-doped layer 102. The temperature is then lowered to about 830° C. to grow a shell of about 50 nm in thickness of unintentionally doped $In_{0.05}Ga_{0.95}N$, forming the layer 112. The temperature is then lowered to about 600° C. to grow a shell with a thickness equal to about 3 unintentionally doped InN monolayers, forming the first InN layer 106. The temperature is raised to about 720° C. to grow a shell with a thickness equal to about 1 nm of unintentionally doped $In_{0.2}Ga_{0.8}N$, forming the separating layer 110. The temperature is lowered again to about 600° C. to grow a shell with a thickness equal to about 2 unintentionally doped InN monolayers, forming the second InN layer 108. The temperature is raised again to about 750° C. to grow a shell with a thickness equal to about 10 nm of unintentionally doped $In_{0.12}Ga_{0.88}N$, forming the layer 114. The active area 105 here forms a stack of shells over each other. The temperature is lowered to about 720° C. to grow a shell with a thickness equal to about 500 nm of magnesium-doped $In_{0.18}Ga_{0.82}N$, forming the p-doped layer 104. The second metal electrode 103 is then made as a Ni/Au layer on the Mg-doped $In_{0.18}Ga_{0.82}N$ shell, and the first metal electrode 101 is then made as a Ti/Au layer on the Si-doped GaN layer located between the GaN nanowires (Si-n-doped layer 102 previously described). Before depositing the metal electrode 101, the Ni/Au electrode 103 which is also deposited between the wires is etched by fluorinated reactive ion etching for nickel and by KI chemical etching for gold. According to this embodiment, n-doped nanowires connected by an n-doped GaN continuous 2D layer are obtained. In this case, an electrode contacts the p-type outer shell of the nanowires and an electrode contacts the n-type GaN layer between the nanowires.

The different characteristics (thicknesses, doping, etc.) previously set forth for the planar-type LED 100 may be similar for the LED 100 made as nanowires. The temperatures indicated above for making the LED 100 in a planar or nanowire form vary according to the MOVCD device used. Furthermore, in the case of a structure of nanowires, the temperatures may vary as a function of the diameters, lengths and density of the nanowires. To obtain abrupt interfaces between the different layers more or less rich in indium, it is possible to make prior indium depositions at the surface before the InGaN growth and/or to make an indium evaporation at the surface after the InGaN growth.

The invention claimed is:

1. A light emitting diode comprising:
   at least one n-doped $In_{Xn}Ga_{(1-Xn)}N$ layer and a p-doped $In_{Xp}Ga_{(1-Xp)}N$ layer forming together a p-n junction of the light emitting diode; and
   an active area arranged between the n-doped $In_{Xn}Ga_{(1-Xn)}N$ layer and the p-doped $In_{Xp}Ga_{(1-Xp)}N$ layer and wherein radiative recombinations are able to occur, the active area comprising:
   a first InN layer with a thickness $e_{InN106}$;
   a second InN layer with a thickness $e_{InN108}$;
   a separating layer arranged between the first InN layer and the second InN layer and such that the first InN layer is arranged between the separating layer and the n-doped $In_{Xn}Ga_{(1-Xn)}N$ layer, the separating layer comprising $In_{Xb}Ga_{(1-Xb)}N$ and a thickness lower than or equal to 3 nm;
   an $In_{X1}Ga_{(1-X1)}N$ barrier layer arranged between the n-doped $In_{Xn}Ga_{(1-Xn)}N$ layer and the first InN layer;
   an $In_{X2}Ga_{(1-X2)}N$ barrier layer arranged between the p-doped $In_{Xp}Ga_{(1-Xp)}N$ layer and the second InN layer;
   wherein the indium compositions Xn, Xp, Xb, X1 and X2 are between 0 and 0.25,
   the thicknesses $e_{InN106}$ and $e_{InN108}$ are such that $e_{InN106} \le e_{InN108}$, and
   the first and second InN layers and the separating layer are configured so that the first InN layer traps electrons and the second InN layer forms a hole reserve from which holes switch to the first InN layer through the separation layer by tunnel effect, leading to obtain more radiative recombination in the first InN layer than in the second InN layer.

2. The light emitting diode according to claim 1, wherein the thicknesses $e_{InN106}$ and $e_{InN108}$ are between 1 monolayer and 3 monolayers.

3. The light emitting diode according to claim 2, wherein, when one or each of the first InN layer and the second InN layer has a thickness between 2 monolayers and 3 monolayers, the indium composition Xb is higher than or equal to about 0.15, or when the indium composition Xb is lower than about 0.15, the thickness of the one or each of the first InN layer and the second InN layer is lower than or equal to 2 monolayers.

4. The light emitting diode according to claim 1, wherein the indium compositions X1 and X2 are such that X1≤X2, or wherein the indium compositions Xn, Xp, Xb, X1 and X2 are such that Xn<X1<X2<Xp, or such that Xn=Xp=0 and/or X1=Xb=X2.

5. The light emitting diode according to claim 1, wherein the thickness of the n-doped $In_{Xn}Ga_{(1-Xn)}N$ layer and/or the thickness of the p-doped $In_{Xp}Ga_{(1-Xp)}N$ layer is between about 20 nm and 10 μm, and/or the thickness of the $In_{X1}Ga_{(1-X1)}N$ layer and/or the thickness of the $In_{X2}Ga_{(1-X2)}N$ layer is between about 1 nm and 200 nm.

6. The light emitting diode according to claim 1, further comprising a first metal electrode arranged against the n-doped $In_{Xn}Ga_{(1-Xn)}N$ layer and a second metal electrode arranged against the p-doped $In_{Xp}Ga_{(1-Xp)}N$ layer.

7. The light emitting diode according to claim 1, wherein the active area includes a number of InN layers higher than 2, each of the InN layers A being separated from each of the adjacent InN layers by a separating layer comprising InGaN or GaN and with a thickness lower than or equal to 3 nm.

8. The light emitting diode according to claim 1, comprising plural active areas arranged between the n-doped $In_{Xn}Ga_{(1-Xn)}N$ layer and the p-doped $In_{Xp}Ga_{(1-Xp)}N$ layer and wherein radiative recombinations are able to occur.

9. The light emitting diode according to claim 1, further comprising, between the n-doped $In_{Xn}Ga_{(1-Xn)}N$ layer and the active area, an n-doped InGaN buffer layer, the n-doped InGaN of the buffer layer including a band gap energy lower than or equal to about 97% of the band gap energy of the p-doped $In_{Xp}Ga_{(1-Xp)}N$.

10. A method for making a light emitting diode according to claim 1, wherein the layers of the light emitting diode are planar layers made by growing over each other, or wherein the layers of the light emitting diode are made by growing as radial or axial nanowires.

11. The light emitting diode of claim 1, wherein each of said barrier layers has a thickness greater than said thickness of the separating layer.

12. The light emitting diode of claim 11, wherein said thickness of each of said barrier layers is from 1-500 nm.

* * * * *